US009552101B2

(12) United States Patent
Park et al.

(10) Patent No.: US 9,552,101 B2
(45) Date of Patent: *Jan. 24, 2017

(54) TOUCH SCREEN ASSEMBLY

(71) Applicant: LG INNOTEK CO., LTD., Seoul (KR)

(72) Inventors: Hongchun Park, Seoul (KR); Hansoo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/197,256

(22) Filed: Jun. 29, 2016

(65) Prior Publication Data

US 2016/0313854 A1    Oct. 27, 2016

Related U.S. Application Data

(63) Continuation of application No. 14/573,821, filed on Dec. 17, 2014, now Pat. No. 9,405,316, which is a (Continued)

(30) Foreign Application Priority Data

Sep. 27, 2010  (KR) .......................... 10-2010-0093398

(51) Int. Cl.
*G06F 3/041*     (2006.01)
*G06F 3/044*     (2006.01)
(Continued)

(52) U.S. Cl.
CPC ............ *G06F 3/0416* (2013.01); *G06F 3/044* (2013.01); *G06F 3/0412* (2013.01); *H05K 1/03* (2013.01);
(Continued)

(58) Field of Classification Search
CPC .... G06F 3/03547; G06F 3/041; G06F 3/0412; G06F 3/0414; G06F 3/046; G06F 3/047; G06F 2203/041; G06F 3/044; G06F 3/045; G06F 2203/04111; G06F 2203/04112; G06F 2203/04113; G06F 1/16; G06F 3/0416; G06F 2203/04103; H05K 1/09; H05K 1/03; H05K 1/092; H05K 1/111; H05K 2201/0145; H05K 2201/0154; H01L 2924/0002

See application file for complete search history.

(56) References Cited

U.S. PATENT DOCUMENTS 6,677,542 B2 *  1/2004  Katakami ............... G06F 3/045
                                                        178/18.05
7,633,564 B2   12/2009  Hong et al.
(Continued)

FOREIGN PATENT DOCUMENTS

JP       09258882 A    10/1997
JP       2004151956 A   5/2004
(Continued)

OTHER PUBLICATIONS

International Search Report in International Application No. PCT/KR2011/005254, filed Jul. 16, 2011.
(Continued)

*Primary Examiner* — Lun-Yi Lao
*Assistant Examiner* — Jarurat Suteerawongsa
(74) *Attorney, Agent, or Firm* — Saliwanchik, Lloyd & Eisenschenk

(57) ABSTRACT

The present invention relates to a touch screen panel and a touch screen assembly including the touch screen panel, the touch screen panel including a substrate; a transparent electrode layer formed on the substrate and defined by a touch area; a plurality of conductive wires electrically connected to the transparent electrode layer; and an insulation film stacked on an upper surface of the transparent electrode layer, wherein each of the plurality of conductive wires is electrically connected to a conductive line inside the insulation film, and the conductive line is extended to an
(Continued)

outside of the insulation film and exposed therefrom, whereby a PCB and conductive wires can be improved in electrical reliability.

24 Claims, 4 Drawing Sheets

Related U.S. Application Data continuation of application No. 13/825,496, filed as application No. PCT/KR2011/005254 on Jul. 16, 2011, now Pat. No. 9,329,625.

(51) Int. Cl.
    *H05K 1/09*    (2006.01)
    *H05K 1/03*    (2006.01)
    *H05K 1/11*    (2006.01)

(52) U.S. Cl.
    CPC ............... *H05K 1/092* (2013.01); *H05K 1/111* (2013.01); *G06F 2203/04103* (2013.01); *H05K 2201/0145* (2013.01); *H05K 2201/0154* (2013.01)

(56) References Cited

U.S. PATENT DOCUMENTS

| | | |
|---|---|---|
| 2009/0201268 A1 | 8/2009 | Endo et al. |
| 2010/0007627 A1 | 1/2010 | Lai et al. |
| 2010/0013786 A1* | 1/2010 | Nishikawa ............ G06F 1/1624 345/173 |
| 2010/0182249 A1* | 7/2010 | Kang ...................... G06F 3/044 345/173 |
| 2010/0201640 A1* | 8/2010 | Nozawa .................. G06F 3/045 345/173 |
| 2010/0220071 A1* | 9/2010 | Nishihara ............. G06F 3/0416 345/173 |
| 2011/0234509 A1* | 9/2011 | Lee .......................... G06F 3/041 345/173 |
| 2011/0242020 A1 | 10/2011 | Kang et al. |

FOREIGN PATENT DOCUMENTS

| | | |
|---|---|---|
| JP | 2004213610 A | 7/2004 |
| JP | 2005339290 A | 12/2005 |
| KR | 102009010733 A | 10/2009 |
| TW | I232989 B | 5/2005 |
| TW | I271879 B | 1/2007 |

OTHER PUBLICATIONS

Office Action dated May 29, 2013 in Taiwanese Application No. 100124567, filed Jul. 12, 2011.
Office Action dated Feb. 9, 2016 in Japanese Application No. 2013-531474.
Office Action dated Apr. 14, 2015 in U.S. Appl. No. 14/573,821.

* cited by examiner

TOUCH SCREEN ASSEMBLY

CROSS-REFERENCE TO RELATED APPLICATIONS

This application is a continuation of U.S. application Ser. No. 14/573,821, filed Dec. 17, 2014, which is a continuation of U.S. application Ser. No. 13/825,496, filed Mar. 21, 2013 now U.S. Pat. No. 9,329,625, issued May 3, 2016, which is the U.S. national stage application of international Patent Application No. PCT/KR2011/005254, filed Jul. 16, 2011, which claims priority to Korean Patent Application No. 10-2010-0093398, filed Sep. 27, 2010, which are hereby incorporated by reference in their entirety.

BACKGROUND

Technical Field

The teachings in accordance with the exemplary embodiments of this invention relate generally to a touch screen panel, and more particularly to a touch screen panel capable of preventing cracks of electric conductive wires during electrical connection with a PCB (printed circuit board), and a touch screen assembly including the touch screen panel.

Background of the Invention

A touch screen or touch panel is a display which can detect the location of touches within the display area, usually performed either with the human hand or a stylus. This allows the display to be used as an input device capable of performing an overall control of electronic devices including a display screen control.

Technically speaking, the commonly used touch screens employ resistive, capacitive, surface acoustic wave (SAW), electromagnetic, vector force and optical touch triodes. Among these types of touch screens, the capacitance type touch screen is increased in its application scope due to the fact that it adopts capacity changes generated from the combination of static electricity between arranged transparent electrodes and a human body, so as to detect coordinates of the contact position through a generated induced current.

That is, the capacitance type touch screen includes one substrate having an electrode formed thereon. In the capacitance type touch panel, when, for example, a finger contacts and approaches the touch panel, a variation in capacitance between the electrode and the finger is detected, thereby detecting input coordinates.

Since the capacitance type touch panel is a non-contact type, it has high durability, excellent environmental and mechanical reliability due to changeable upper barrier layer unlike the resistive film type touch panel.

Generally, a touch screen is manufactured using a touch screen panel which in turn comprised of a substrate formed with a touch area, and an electric wire connected to the touch area. At this time, the electric wire is electrically connected by a PCB and an ACT (anisotropic conductive film), where U-type cracks are disadvantageously generated due to excessive pressure to the electric wire during mounting to disable an electrical signal to be conductive to the touch area.

DETAILED DESCRIPTION

Technical Problem

The present invention is directed to solve the aforementioned disadvantages or shortcomings, and is to provide a touch screen panel capable of preventing cracks of electric conductive wires when connected to a PCB, and a touch screen assembly including the same.

Technical problems to be solved by the present invention are not restricted to the above-mentioned, and any other technical problems not mentioned so far will be clearly appreciated from the following description by skilled in the art.

Technical Solution

An object of the invention is to solve at least one or more of the above problems and/or disadvantages in a whole or in part and to provide at least the advantages described hereinafter. In order to achieve at least the above objects, in whole or in part, and in accordance with the purposes of the invention, as embodied and broadly described, and in one general aspect of the present invention, there is provided a touch screen panel, the panel comprising: a substrate; a transparent electrode layer formed on the substrate and defined by a touch area; a plurality of conductive wires electrically connected to the transparent electrode layer; and an insulation film stacked on an upper surface of the transparent electrode layer, wherein each of the plurality of conductive wires is electrically connected to a conductive line inside the insulation film, and the conductive line is extended to an outside of the insulation film and exposed therefrom.

Preferably, one end of the conductive line is electrically and connectively overlapped with an end of the conductive line at an inside of the insulation film.

Preferably, the conductive line is a cured metal paste.

Preferably, width of the conductive line is wider than that of the conductive wire.

Preferably, the insulation film covers the transparent electrode layer and the conductive wire.

Preferably, the conductive line is a metal paste in which polymeric resin and metal particles are mixed.

Preferably, the metal particles are any one or more metals of gold, silver, copper, platinum, palladium, rhodium, ruthenium, nickel and aluminum, or an alloy of more than two or metals thereof.

Preferably, the substrate is one of a PI (Polyimide) film substrate, a PET (Polyethylene terephthalate) film substrate, a PC (Polycarbonate) film substrate and a glass substrate.

In another general aspect of the present invention, there is provided a touch screen assembly, the assembly comprising: a touch screen panel including a transparent electrode layer formed on a substrate, a plurality of conductive wires extended by being electrically connected to the transparent electrode layer, and a touch screen panel including an insulation film covering the transparent electrode layer and the conductive wires; and a PCB formed with a pad corresponding to the conductive wire of the touch screen panel.

Preferably, each of the plurality of conductive wires is electrically connected to the conductive line, and the conductive line is electrically connected to the pad of the PCB.

Preferably, the conductive line is extended to an inner side of the insulation film to be electrically and connectively overlapped with an end of the conductive line, and extended to an outside of the insulation film to be electrically connected to the pad of the PCB.

Preferably, the conductive wire is extended to the outside of the insulation film, and the conductive wire extended to the outside of the insulation film is stacked by the conductive line.

Preferably, the conductive line is a cured metal paste.

Preferably, the length of the pad at the PCB is shorter than that of the conductive line.

Preferably, the touch screen panel is formed with an upper plate and a bottom plate, each of the upper plate and the bottom plate is formed with a touch area.

Preferably, the PCB and the conductive line are electrically connected by an anisotropic conductive adhesive.

Preferably, the conductive line is a metal paste in which polymeric resin and metal particles are mixed.

Preferably, the metal particles are any one or more metals of gold, silver, copper, platinum, palladium, rhodium, ruthenium, nickel and aluminum, or an alloy of more than two or metals thereof.

Preferably, the transparent electrode layer is defined by a touch area.

Preferably, the substrate is one of a PI film substrate, a PET film substrate, a PC film substrate and a glass substrate.

Advantageous Effects

The touch screen panel and a touch screen assembly according to the present invention have advantageous effects in that degree of integration in pattern can be enhanced, and an electrical reliability between a PCB and a conductive wire can be improved.

DESCRIPTION OF THE DRAWINGS

The teachings of the present invention can be readily understood by considering the following detailed description in conjunction with the accompanying drawings, in which.

BEST MODE FOR INVENTION

Figure 1:
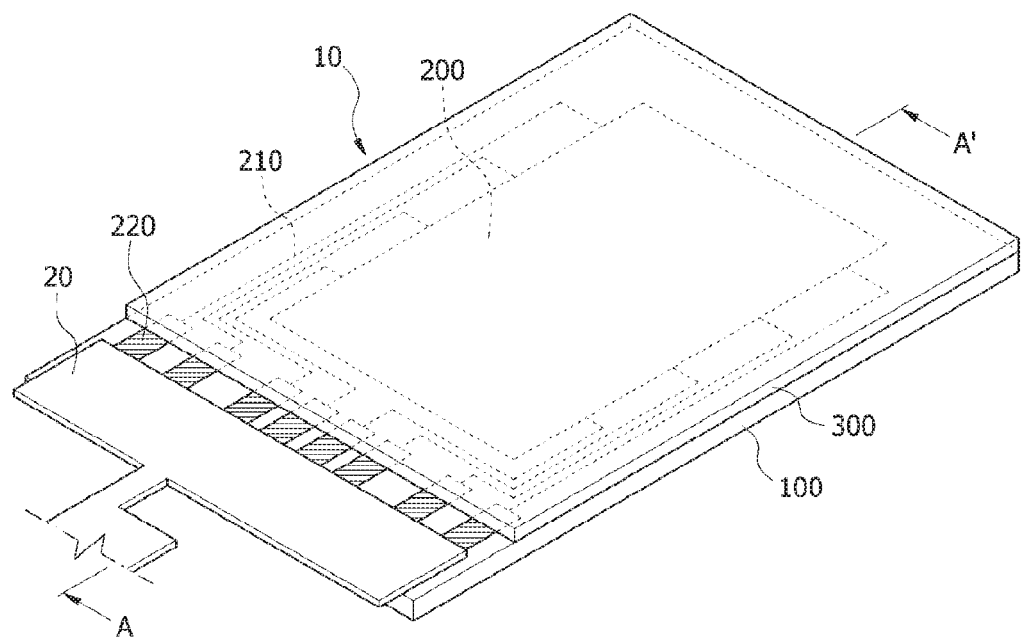
FIG. 1 is a perspective view illustrating a touch screen assembly in which a touch screen panel is electrically connected to a PCB according to an exemplary embodiment of the present invention.

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

The disclosed embodiments and advantages thereof are best understood by referring to FIGS. 1-7 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof are used in the detailed description and/or the claims to denote non-exhaustive inclusion in a manner similar to the term "comprising".

Furthermore, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted.

It is to be understood that the singular forms "a," "an," and the include plural referents unless the context clearly dictates otherwise. Thus, for example, reference to "a component surface" includes reference to one or more of such surfaces.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Now, the present invention will be described in detail with reference to the accompanying drawings.

Figure 2:
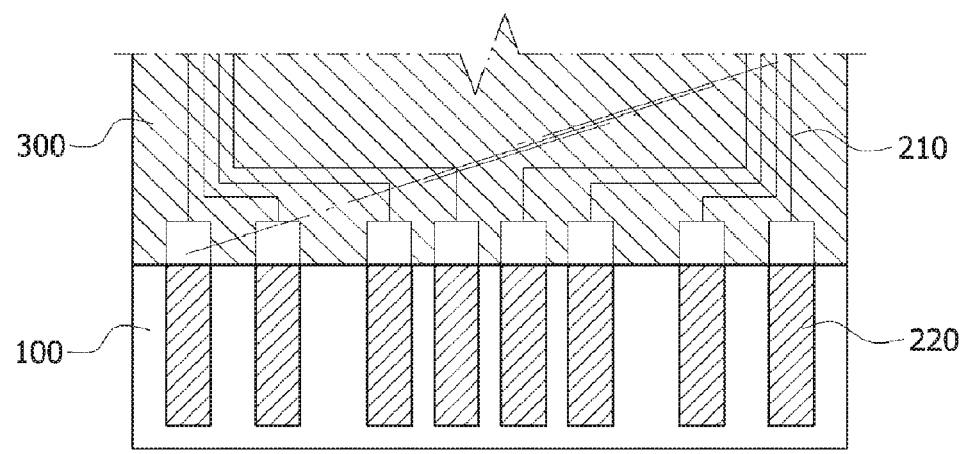
FIG. 2 is a plan view illustrating a connective status in which a conductive wire of the touch screen panel and a conductive line are connected according to an exemplary embodiment of the present invention.
Figure 3:
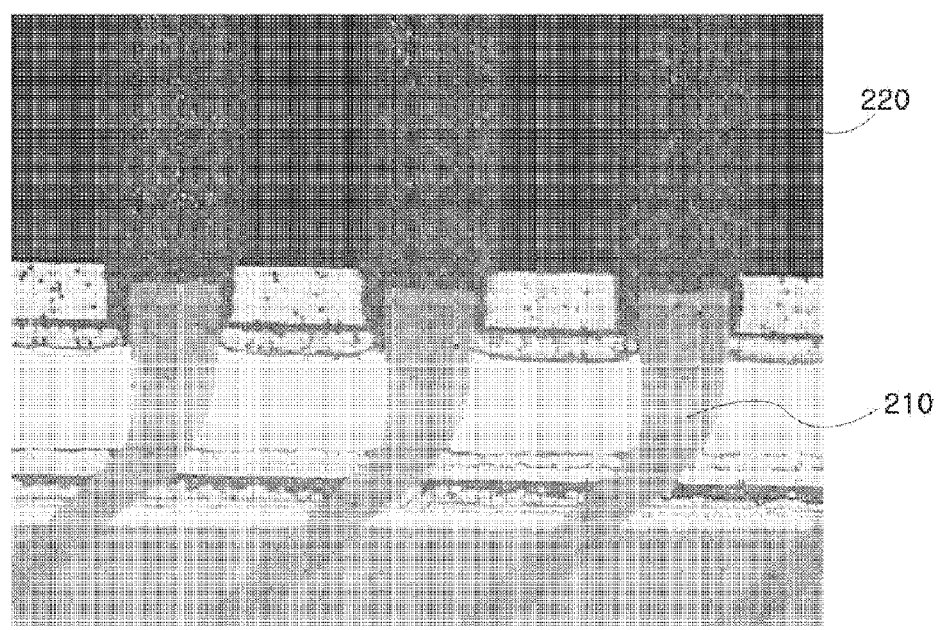
FIG. 3 is a photograph illustrating a status in which a conductive line is electrically connected to a conductive wire according to an exemplary embodiment of the present invention.

FIG. 1 is a perspective view illustrating a touch screen assembly in which a touch screen panel is electrically connected to a PCB according to an exemplary embodiment of the present invention, FIG. 2 is a plan view illustrating a connective status in which a conductive wire of the touch screen panel and a conductive line are connected according to an exemplary embodiment of the present invention, and FIG. 3 is a photograph illustrating a status in which a conductive line is electrically connected to a conductive wire according to an exemplary embodiment of the present invention.

A touch screen panel (10) according to an exemplary embodiment of the present invention includes a substrate (100), a transparent electrode layer (200) formed on the substrate (100) and defined as a touch area, a plurality of conductive lines (210) electrically connected to an external side of the transparent electrode layer (200) and an insulation film (300) stacked on the transparent electrode layer (200).

The substrate (100) may be used with any transparent material, and to be more specific, the substrate (100) may use any one of a PI (polyimide) film substrate, a PET (Polyethylene terephthalate) film substrate, a PC (Polycarbonate) film substrate and a glass substrate.

The transparent electrode layer (200) is formed on the substrate (100) to define a touch area. Although not illustrated in the drawings, the transparent electrode layer may be plurally formed on the center of the substrate (100), each discrete and extended to a predetermined direction.

The transparent electrode layer (200) may be applied with any transparent electrode such as an ITO (Indium Tin Oxide) film, an IZO (Indium Zinc Oxide) film or an IZIO film. Furthermore, a position sensing method using a transparent electrode and arrangement of the transparent electrode layer (200) is the same as that of a general touch screen panel, such that there will be no more detailed explanation thereto.

The external side of the transparent electrode layer (200) is connected by a plurality of conductive wires (210). The plurality of conductive wires (210) is electrically connected to the transparent electrode layer (200) and arranged to a periphery of the substrate (100) to be electrically connected to a PCB (Printed Circuit Board).

The conductive wires (210) may be advantageous in that a metal is used to form thin conductive wires using methods such as deposition, sputtering or screen printing process, and even if the plurality of conductive wires is formed, there is relatively less restriction by space.

The insulation film (300) may be formed in a size large enough to cover the transparent electrode layer (200) and the conductive wires (210). Thus, the conductive wires are prevented from being oxidized or corroded, because of being covered by the insulation film (300).

The insulation film (300) may be advantageous in terms of transparency and adhesion if an OCA (Optical Clear Adhesive) film is selected for the insulation film (300). However, material for insulation film is not limited thereto, and any insulation films may be used as long as insulation, transparency and adhesiveness are excellent.

Referring to FIG. 2, the conductive wires (210) are electrically connected to conductive lines (220) inside the insulation film (300), and the conductive lines (220) are extended to outside of the insulation film (300) and exposed therefrom, a detailed explanation of which will be provided with reference to FIG. 3.

The conductive wire (210) is covered by the insulation film (300) and a distal end of the conductive line (220) is inserted into the insulation film (300) to be electrically and overlappingly connected to a distal end of the conductive wire (210). At this time, width of the conductive line (220) may be formed in 20~40 μm, wider than that of the conductive wire, (210) to be stably and electrically connected to the conductive wire (210) or a PCB (20).

The conductive line (220) may be formed by a cured metal paste in which polymeric resin and metal particles are mixed. The polymeric resin mixed by metal particles may be selected of thermosetting resin cured by heat or ultraviolet, and the metal particles may be any one or more metals of gold, silver, copper, platinum, palladium, rhodium, ruthenium, nickel and aluminum, or an alloy of more than two or metals thereof.

Although not illustrated in the drawing, the conductive wire (210) may be extended to outside of the insulation film (300) and exposed therefrom, and the conductive line (220) may be stacked along an extended direction of the conductive wire (210).

Figure 4:
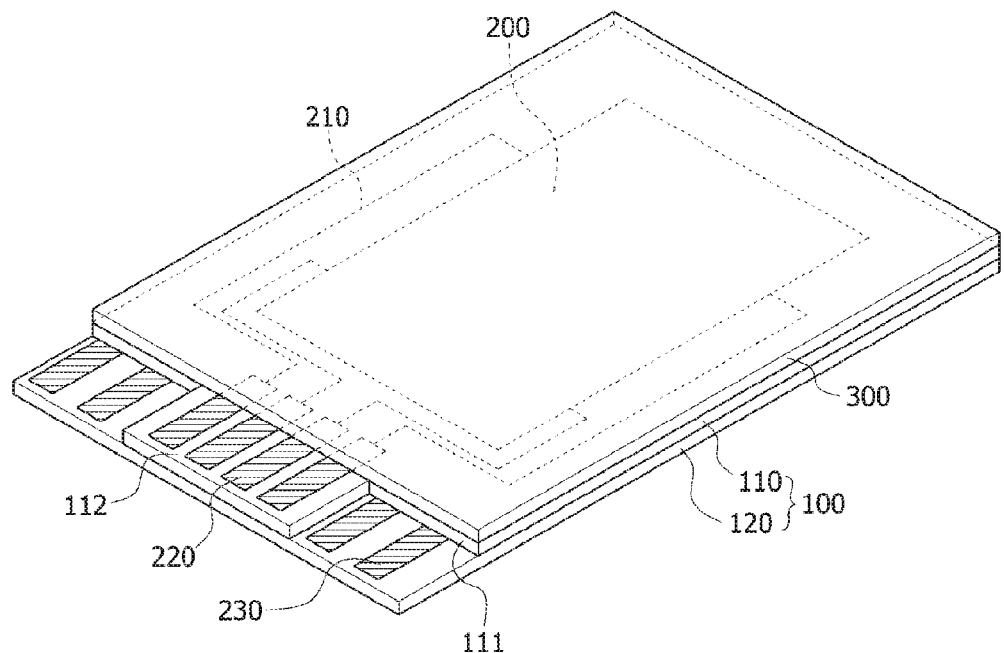
FIG. 4 is a perspective view illustrating structure of a touch screen panel formed with an upper and bottom substrates according to an exemplary embodiment of the present invention.

FIG. 4 is a perspective view illustrating a modified structure of a touch screen panel formed with an upper and bottom substrates according to an exemplary embodiment of the present invention.

The structure of a touch screen panel according to an exemplary embodiment of the present invention may be applied to any mode regardless of resistive or capacitance type touch screen panel. For example, in case of a capacitance type touch screen panel formed with a plurality of substrates (100), an electrode layer is respectively formed on an upper substrate (110) and a bottom substrate (120) as illustrated in FIG. 4, a distal end of the conductive wire (210) is formed with conductive lines (220, 230) to be positioned at a distal end of the substrate (100). At this time, upper surfaces of the upper substrate (110) and the bottom substrate (120) are respectively formed with insulation film (300).

At this time, in consideration of electrical connection with the PCB (20), both corners of a distal end at the substrate (100) may be formed with cut-out units (111), and the upper conductive line (220) may be arranged on a center lug (112) and the bottom substrate (120) may be formed at a periphery thereof with the bottom conductive line (230). Alternatively, the upper conductive line (220) may be arranged on both sides of the distal end of the upper substrate (11), and the bottom conductive line (230) may be arranged on a center of the distal end. It should be apparent that the transparent electrode layer is modified in arrangement thereof to cope with the configuration.

Hereinafter, a touch screen assembly structure in which the touch screen panel and the PCB are electrically connected by an anisotropic conductive adhesive will be described in detail.

MODE FOR INVENTION

Figure 5:
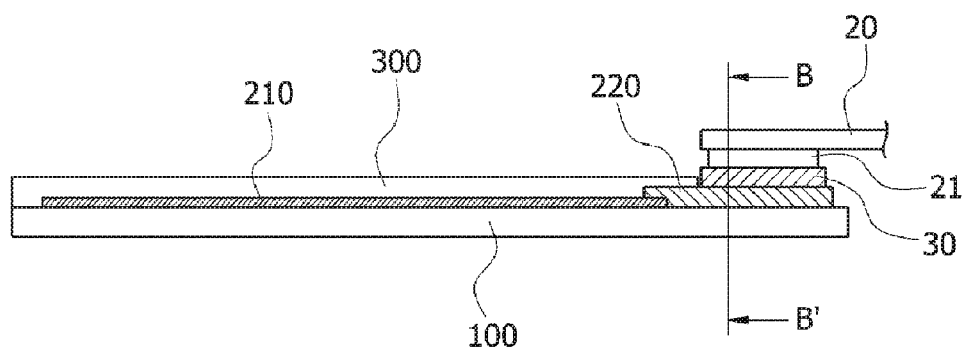
FIG. 5 is a cross-sectional view taken along A-A' of FIG. 1.
Figure 6:
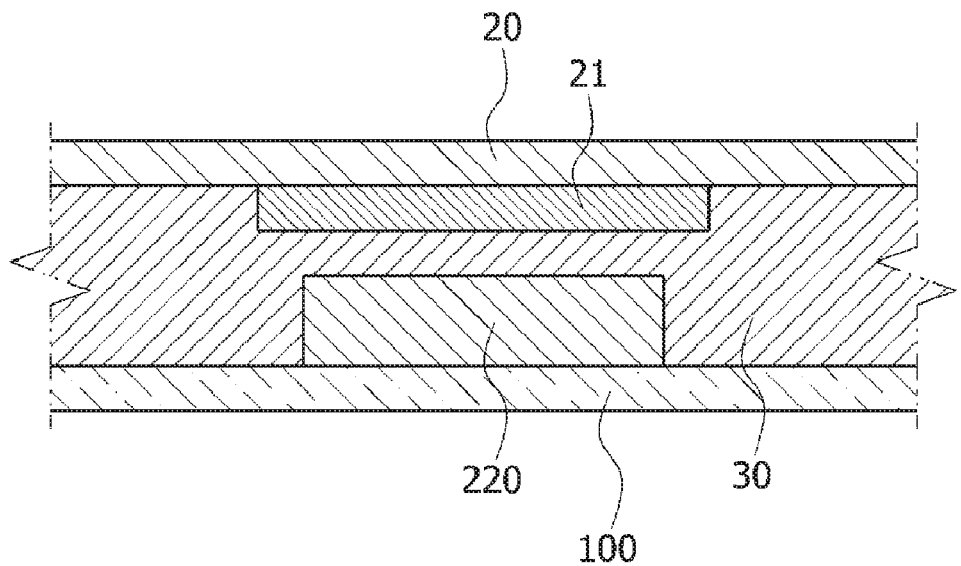
FIG. 6 is a cross-sectional view taken along B-B of FIG. 5.

FIG. 5 is a cross-sectional view taken along A-A' of FIG. 1, and FIG. 6 is a cross-sectional view taken along B-B' of FIG. 5.

A touch screen assembly according to an exemplary embodiment of the present invention includes a transparent electrode layer (200) formed on a substrate (100), a plurality of conductive wires (210) extended by being electrically connected to the transparent electrode layer (200), a touch screen panel including an insulation film (300) covering the transparent electrode layer (200) and the conductive wires (210); and a PCB (20) formed with a pad (1) corresponding to the conductive wire of the touch screen panel.

The touch screen panel is the same as what is explained before, the conductive wire (210) is electrically connected to the conductive line (220) and the PCB pad (21) is electrically connected to the conductive line (220). At this time, the PCB pad (21) and the conductive line (220) are electrically connected by an anisotropic conductive adhesive (30).

Predetermined heat and pressure are applied to fuse the polymeric resin of the anisotropic conductive adhesive (30) to cause conductive balls (not shown) included in the anisotropic conductive adhesive (30) to be mechanically and physically coupled to the PCB pad (21) and the conductive line (220).

However, the conductive line (220) does not develop cracks because of being configured with cured metal paste. Therefore, the conductive wire (210) electrically connected to a distal end of the conductive line (220) can be stably and electrically connected to the PCB pad (21).

The exemplary embodiment of the present invention is advantageous in that an electrical disconnection caused by cracks on the conductive wire by pressure for electrical connection with the PCB can be eliminated.

Figure 7:
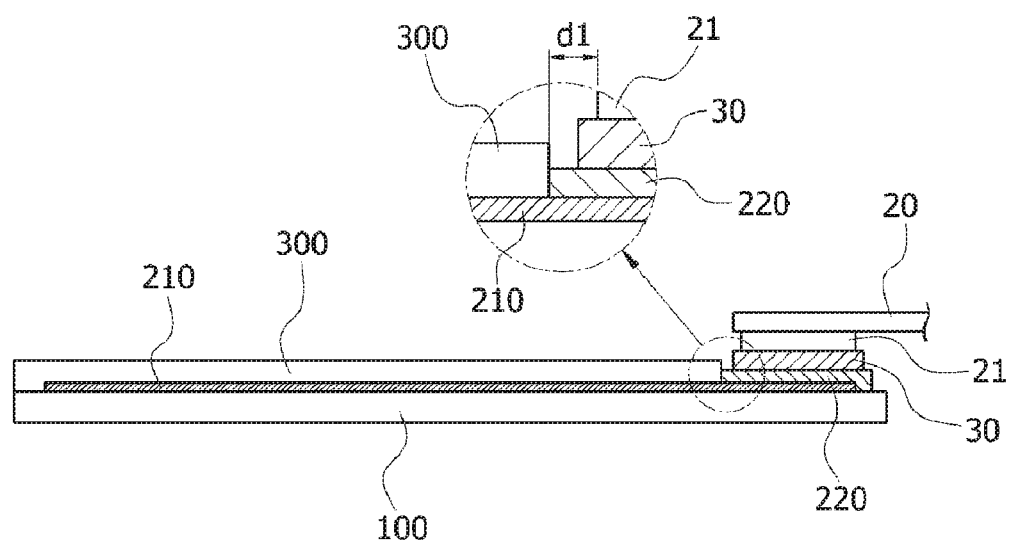
FIG. 7 is a modified example of a touch screen panel according to an exemplary embodiment of the present invention.

FIG. 7 is a modified example of a touch screen panel according to an exemplary embodiment of the present invention.

A touch screen assembly according to another exemplary embodiment of the present invention may be configured in such a manner that a conductive wire (210) of the touch screen panel is exposed outside of an insulation film (300) on which a conductive line (220) is formed. At this time, a horizontal width of the conductive line (220) is longer than a horizontal width of the PCB (20) by a predetermined length (d1). Therefore, even if the conductive wire (210) corresponding to the PCB pad (21) develops cracks to disable an electrical conduction, a portion (d1) of conductive wire not corresponding to the PCB pad (21) develops no cracks to allow the conductive line (220) and the PCB pad (21) to be stably and electrically connected.

Now, a manufacturing method of the touch screen assembly will be described in detail.

The manufacturing method of a touch screen assembly according to an exemplary embodiment of the present invention may be largely divided into a touch screen panel manufacturing step and a PCB mounting step.

The touch screen panel is such that the transparent electrode layer (200) is formed on the substrate (100), which is patterned to form a touch area. Thereafter, the conductive wire (210) electrically connected to the transparent electrode layer (200) is formed by deposition or sputtering method.

The distal end of the conductive wire (210) is evenly laminated with silver paste of conductive line (220) at a thickness wider than the width of the conductive wire (210) and then cured. At this time, resin for the silver paste may be applied with the cured resin, and replace the function of the conductive wire (210) because of no re-fusion with the PCB in the connection process.

Then, the insulation film (300) with a size large enough to cover the transparent electrode layer (200) and the conductive line (210) is manufactured and laminated whereby the process of manufacturing the touch screen panel. At this time, if the touch screen panel is comprised of a plurality of substrates (100), the aforementioned process of manufacturing the touch screen panel may be performed in plural times.

In the mounting step of the PCB, the plurality of conductive lines (220) and a plurality of pads (410) of the PCB (20) are oppositely arranged and the anisotropic conductive adhesive (30) is arranged therebetween.

Successively, a predetermined heat/pressure is applied to narrow a gap between the PCB (20) and the touch screen panel. The anisotropic conductive adhesive (30) is fused through the heating/pressing processes, and conductive particles dispersed therein are restricted between the conductive line (220) and the PCB pad (21) by mechanical and physical coupling and is electrically conducted. At this time, the anisotropic conductive adhesive (30) may further include heat radiating particles for easily radiating the heat that is generated by electrical flow.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The present invention has an industrial applicability in that degree of integration in pattern can be enhanced, and an electrical reliability between a PCB and a conductive wire can be improved.

What is claimed is:

1. A touch screen assembly, comprising:
   a substrate;
   a transparent electrode layer on the substrate;
   a plurality of touch conductive wires electrically connected to the transparent electrode layer;
   a plurality of conductive lines, at least one of which is directly connected to at least one touch conductive wire of the plurality of touch conductive wires;
   an insulation film on at least a portion of at least one conductive line of the plurality of conductive lines; and
   a PCB with a plurality of pads, at least one of which is electrically connected to at least one conductive line of the plurality of conductive lines,
   wherein the at least one conductive line is electrically connected to the at least one touch conductive wire under the insulation film,
   wherein the at least one conductive line is extended to an outside of the insulation film and exposed therefrom,
   wherein a width of each conductive line is wider than that of each touch conductive wire, and
   wherein a horizontal width of each conductive line is longer than a horizontal width of each pad by a predetermined length.

2. The touch screen assembly of claim 1, wherein one end of the at least one conductive line is in direct physical contact with the at least one touch conductive wire and the substrate.

3. The touch screen assembly of claim 1, wherein the exposed portion of the at least one conductive line is in direct physical contact with the substrate.

4. The touch screen assembly of claim 1, wherein one end of each conductive line is disposed on one end of each touch conductive wire.

5. The touch screen assembly of claim 1, wherein one end of each conductive line is overlapped with one end of each touch conductive wire.

6. The touch screen assembly of claim 1, wherein each conductive line comprises a cured metal paste.

7. The touch screen assembly of claim 6, wherein the cured metal paste comprises polymeric resin and metal particles.

8. The touch screen assembly of claim 7, wherein the metal particles comprise gold, silver, copper, platinum, palladium, rhodium, ruthenium, nickel, aluminum, or an alloy of any thereof.

9. The touch screen assembly of claim 1, wherein the plurality of touch conductive wires is directly physically connected to the plurality of conductive lines, respectively.

10. The touch screen assembly of claim 1, wherein the substrate comprises a polyimide (PI) film, a polyethylene terephthalate (PET) film, a polycarbonate (PC) film, or a glass.

11. The touch screen assembly of claim 1, wherein the insulation film is transparent.

12. The touch screen assembly of claim 1, wherein the insulation film is adhesive.

13. The touch screen assembly of claim 1, wherein the insulation film comprises an optical clear adhesive (OCA) film.

14. The touch screen assembly of claim 1, wherein the at least one conductive line is thicker than the at least one touch conductive wire.

15. The touch screen assembly of claim 1, wherein each conductive line is thicker than each touch conductive wire.

16. The touch screen assembly of claim 1, wherein a length of the exposed portion of the at least one conductive line is longer than that of said conductive line under the insulation film.

17. The touch screen assembly of claim 1, further comprising an anisotropic conductive adhesive electrically connecting at least one pad of the plurality of pads to the at least one conductive line.

18. The touch screen assembly of claim 1, wherein the horizontal width of each conductive line and the horizontal width of each pad are taken in a first direction parallel to the upper surface of the substrate; and wherein the width of each conductive line, taken in a second direction perpendicular to the first direction and parallel to the upper surface of the substrate, is smaller than a width of each pad taken in the second direction.

19. The touch screen assembly of claim 1, wherein each conductive line comprises material different from that of each touch conductive wire.

20. The touch screen assembly of claim 1, wherein one end of each conductive line is disposed on and overlapped with one end of each touch conductive wire.

21. The touch screen assembly of claim 1, wherein the touch screen assembly comprises an upper plate and a bottom plate, and wherein the plurality of touch conductive wires and the plurality of conductive lines are formed on at least one of the upper plate and the bottom plate.

22. The touch screen assembly of claim 1, wherein at least one pad of the plurality of pads is disposed on the exposed portion of the at least one conductive line and electrically connected to said at least one conductive line.

23. The touch screen assembly of claim 1, wherein one end of each conductive line is in direct contact with one end of each touch conductive wire and the substrate.

24. The touch screen assembly of claim 1, wherein the exposed portion of the at least one conductive line is in direct contact with the substrate.

\* \* \* \* \*